(12) United States Patent
Tsujii et al.

(10) Patent No.: US 11,811,409 B2
(45) Date of Patent: Nov. 7, 2023

(54) LOAD FREQUENCY CONTROL DEVICE AND LOAD FREQUENCY CONTROL METHOD

(71) Applicant: Hitachi, Ltd., Tokyo (JP)

(72) Inventors: Yuki Tsujii, Tokyo (JP); Shota Omi, Tokyo (JP)

(73) Assignee: HITACHI, LTD., Tokyo (JP)

(*) Notice: Subject to any disclaimer, the term of this patent is extended or adjusted under 35 U.S.C. 154(b) by 316 days.

(21) Appl. No.: 17/298,235

(22) PCT Filed: Jan. 24, 2020

(86) PCT No.: PCT/JP2020/002451
§ 371 (c)(1),
(2) Date: May 28, 2021

(87) PCT Pub. No.: WO2020/195078
PCT Pub. Date: Oct. 1, 2020

(65) Prior Publication Data
US 2022/0123739 A1    Apr. 21, 2022

(30) Foreign Application Priority Data
Mar. 26, 2019   (JP) ................................. 2019-058629

(51) Int. Cl.
G05B 15/02     (2006.01)
H03K 5/00      (2006.01)
(Continued)

(52) U.S. Cl.
CPC ......... *H03K 5/00006* (2013.01); *G05B 15/02* (2013.01); *H02J 3/003* (2020.01);
(Continued)

(58) Field of Classification Search
CPC .. G05B 15/02; H02J 2203/10; H02J 2300/20; H02J 3/003; H02J 3/007; H02J 3/0075;
(Continued)

(56) References Cited

U.S. PATENT DOCUMENTS

2017/0317507 A1   11/2017   Kudo

FOREIGN PATENT DOCUMENTS

| JP | 2001-238355 A | 8/2001 |
| JP | 2002-209336 A | 7/2002 |

(Continued)

OTHER PUBLICATIONS

International Search Report, PCT/JP2020/002451, dated Apr. 7, 2020.

*Primary Examiner* — Yuhui R Pan
(74) *Attorney, Agent, or Firm* — Volpe Koenig (57) ABSTRACT

In order to suppress frequency fluctuation caused by a load frequency, an AR calculating section calculates an AR using system frequency deviation and tie-line power flow deviation as inputs. An output distribution ratio determining section determines a ratio of output distribution according to merit order based on the AR calculated by the AR calculating section. An output distributing section determines output distribution according to an output change speed based on the output distribution ratio determined by the output distribution ratio determining section according to the output change speed. An output distributing section determines output distribution according to the merit order based on the output distribution ratio determined by the output distribution ratio determining section according to the merit order. An output distribution instruction value determining section determines an output distribution instruction value to each regulated power source using, as inputs, output distribution values determined by the output distributing sections.

10 Claims, 9 Drawing Sheets

(51) Int. Cl.
*H02J 3/00* (2006.01)
*H02J 3/06* (2006.01)
(52) U.S. Cl.
CPC ............ *H02J 3/007* (2020.01); *H02J 3/0075* (2020.01); *H02J 3/06* (2013.01)
(58) Field of Classification Search
CPC ...... H02J 3/06; H02J 3/241; H02J 3/32; H02J 3/381; H02J 3/472; H02J 3/48; H03K 5/00006
See application file for complete search history.

(56) References Cited

FOREIGN PATENT DOCUMENTS

| | | | |
|---|---|---|---|
| JP | 2007-143375 A | | 6/2007 |
| JP | 2013-062953 A | | 4/2013 |
| JP | 2015-037371 A | | 2/2015 |
| JP | 2015037371 A | * | 2/2015 |
| JP | 2016-019373 A | | 2/2016 |
| WO | 2016-063739 A1 | | 4/2016 |

* cited by examiner

FIG.10

# LOAD FREQUENCY CONTROL DEVICE AND LOAD FREQUENCY CONTROL METHOD

TECHNICAL FIELD

The present invention relates to a load frequency control device and a load frequency control method that can be used for a power system.

BACKGROUND ART

In a power system, when the demand and supply of electricity are not balanced due to a load fluctuation or the like, a frequency fluctuation occurs. In load frequency control (hereinafter referred to as LFC), a load dispatching center calculates a load fluctuation amount for a load fluctuation (including a renewable energy fluctuation) for a time period of several minutes to approximately 20 minutes and instructs each power generator to generate power in amount based on the load fluctuation amount, thereby suppressing a system frequency to an acceptable range. The load frequency amount is defined as an area requirement (hereinafter also referred to as AR in some cases). An output instruction is given to a power generator in such a manner that the AR is satisfied, and thus the balance of the demand and supply can be kept.

The output instruction is not given to all the power generators and is given to the power generator (hereinafter referred to as LFC target power generator) that can change output within a short cycle. In a normal operation, approximately 1% to 2% of a system capacity is secured for regulated power (hereinafter referred to as LFC regulated power) for a load fluctuation for a time period of several minutes to approximately 20 minutes. In each of interconnected power systems, the following two LFC methods are mainly used.

The first LFC method is a flat frequency control method (hereinafter referred to as FFC method). In the FFC method, a system frequency deviation $\Delta f$ is detected and a power generator output instruction is transmitted to the LFC target power generator to reduce the system frequency deviation $\Delta f$ in such a manner that a frequency remains at a specified value.

The second LFC method is a tie line bias control method (hereinafter referred to as TBC method). In the TBC method, a system frequency deviation $\Delta f$ and a tie-line power flow deviation $\Delta Pt$ are detected and a power generator output instruction is transmitted to the LFC target power generator to reduce a value defined based on the system frequency deviation $\Delta f$ and the tie-line power flow deviation $\Delta Pt$ in such a manner that a frequency within a concerned area remains at a specified value. An AR to be used in the TBC method is calculated according to the following Equation (1). In Equation (1), K is a system constant. An AR to be used in the FFC method is calculated by omitting the frequency deviation $\Delta f$ from Equation (1) of the TBC method.

$$AR = -K \times \Delta f + \Delta Pt \tag{1}$$

The AR calculated according to Equation (1) is shared by thermal power generators or hydroelectric generators for each output change speed or the like in such a manner that the demand and supply are balanced. When a large amount of renewable energy generated by solar photovoltaic power generation and wind power generation is introduced to a power system, and the demand and supply are not balanced due to the introduction of the renewable energy, it may not be possible to prevent a frequency fluctuation.

When a power supply-demand adjustment market in which regulated power is traded is established, general transmission and distribution operators procure regulated power in the power supply-demand adjustment market. In addition, in the operation, a mechanism for providing regulated power based on merit order instead of providing regulated power for each output change speed may be installed. In AR distribution based on a merit order method, an AR is distributed to the LFC target power generator on the basis of a priority based on fuel cost. For an increase due to regulated power, the AR is distributed in ascending order of fuel cost. For a reduction due to regulated power, the AR is distributed in descending order of fuel cost. However, in the distribution based on the merit order, the number of power generators to which the AR is distributed may be reduced and a frequency fluctuation may increase.

As a load frequency control method of a power system, there is a technique disclosed in Patent Literature 1. Patent Literature 1 describes a method for calculating an area requirement AR and distributing the AR to each of power generators G1 to Gn in a power system load frequency control system.

CITATION LIST

Patent Literature

Patent Literature 1: Japanese Patent Application Laid-Open No. 2002-209336

SUMMARY OF INVENTION

Technical Problem

However, Patent Literature 1 does not describe the AR distribution based on the merit order method. According to Patent Literature 1, it may not be possible to reduce fuel cost in a state in which a system frequency remains at or lower than a management target value.

The present invention has been made in view of the foregoing facts and an object of the present invention is to provide a load frequency control device and a load frequency control method that reduce cost while suppressing a frequency fluctuation caused by a load fluctuation.

Solution to Problem

To achieve the foregoing object, a load frequency control device according to a first aspect includes an AR calculating section that calculates an area requirement to be used for load frequency control, an output distribution ratio determining section that determines a ratio of output distribution according to an economic efficiency for the area requirement calculated by the AR calculating section, and a first distributing section that determines, based on the ratio determined by the output distribution ratio determining section, output distribution to a regulated power source according to the economic efficiency for the regulated power source.

Advantageous Effects of Invention

According to the present invention, it is possible to reduce cost while suppressing a frequency fluctuation caused by a load fluctuation.

DESCRIPTION OF EMBODIMENTS

Embodiments are described with reference to the drawings. The embodiments described below do not limit the invention according to the claims, and components described in the embodiments and all combinations thereof may not be necessarily essential for means for solving the invention.

Figure 1:
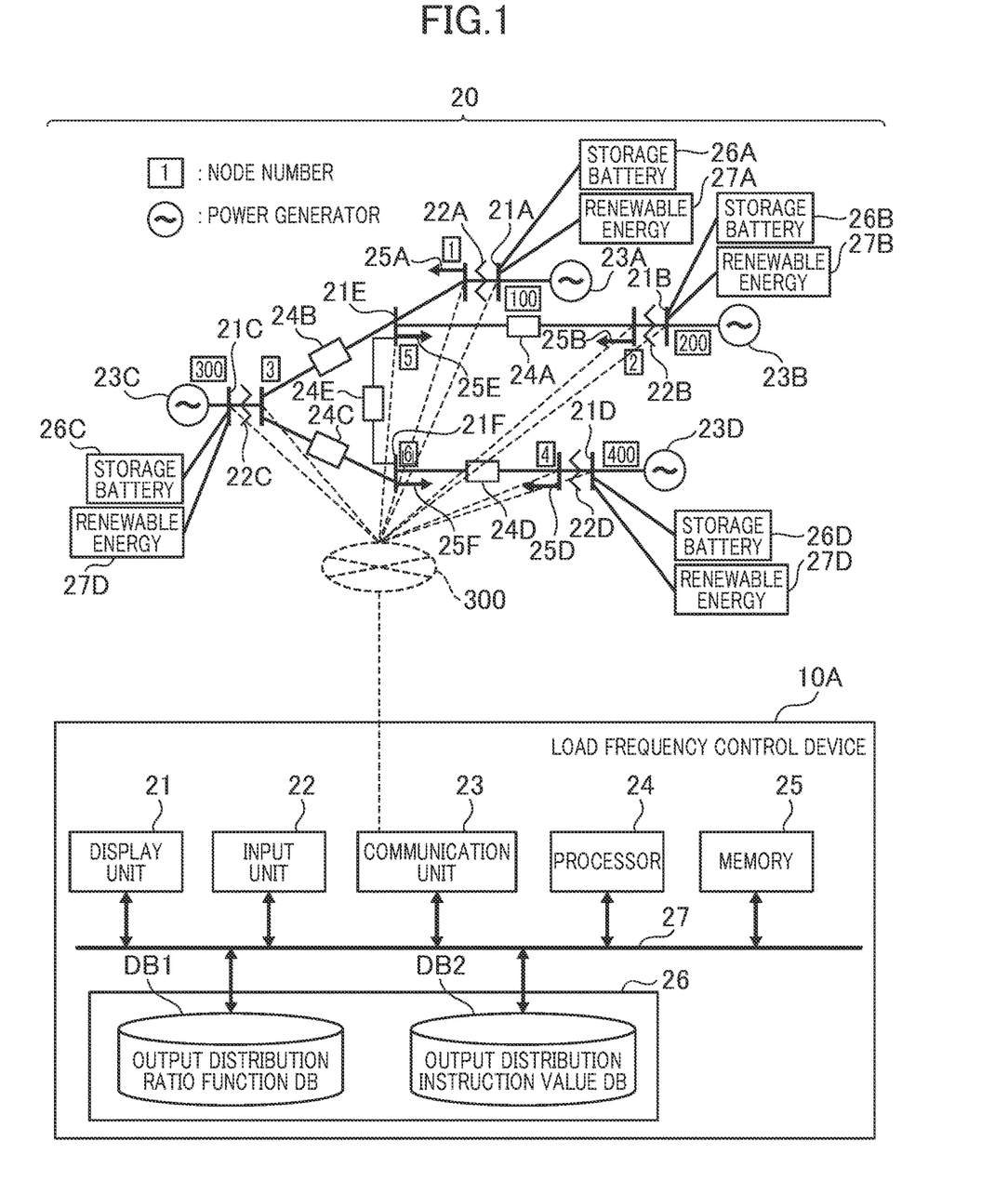
FIG. 1 is a block diagram illustrating a hardware configuration of a load frequency control device connected to a power system according to a first embodiment.

FIG. 1 is a block diagram illustrating a hardware configuration of a load frequency control device connected to a power system according to a first embodiment.

In FIG. 1, the load frequency control device 10A is, for example, constituted by a computer system. The load frequency control device 10A performs load frequency control to suppress a frequency fluctuation caused by a load fluctuation of a power system 20 or the like. In this case, the load frequency control device 10A calculates a load fluctuation amount for a load fluctuation for a time period of several minutes to approximately 20 minutes and instructs each of regulated power sources to provide regulated power based on the load fluctuation amount, thereby suppressing a system frequency to an acceptable range. In the present specification, a distribution destination of output in the load frequency control is referred to as regulated power source. The regulated power source can be selected from at least one of a power generator, a storage battery, and a demand response.

The load frequency control device 10A determines a ratio of output distribution according to an economic efficiency for an AR defining the load fluctuation amount and determines, based on the determined ratio, output distribution according to an economic efficiency for the regulated power source. The output distribution according to the economic efficiency is, for example, output distribution according to merit order. In the output distribution according to the merit order, the load frequency control device 10A can distribute the AR on the basis of a priority based on cost. In this case, for an increase due to regulated power, the load frequency control device 10A can distribute the AR in ascending order of cost. For a reduction due to regulated power, the load frequency control device 10A can distribute the AR in descending order of cost. The cost may include fuel cost for the regulated power source and procurement cost.

The load frequency control device 10A includes a display unit 21, an input unit 22, a communication unit 23, a processor 24, a memory 25, and a storage device 26. The display unit 21, the input unit 22, the communication unit 23, the processor 24, the memory 25, and the storage device 26 are connected to each other via a bus 27.

The display unit 21 displays a parameter to be used by the load frequency control device 10A, a process result of the load frequency control device 10A, and the like. The display unit 21 may be a display device. As the display unit 21, a display device and any of a printer device, an audio output device, and the like may be used along with the display device.

The input unit 22 inputs various conditions for operating the load frequency control device 10A and the like. As the input device 22, a keyboard, a mouse, and the like can be used. The input device 22 may include at least one of a touch panel, an audio instruction device, and the like.

The communication unit 23 includes a circuit to be connected to a communication network 300 and a communication protocol. The communication network 300 may be a wide area network (WAN) such as the Internet or may be a local area network (LAN) such as WiFi or the Ethernet (registered trademark). Alternatively, the communication network 300 may include the WAN and the LAN.

The processor 24 executes a computer program, searches for data within various databases stored in the storage device 26, instructs displaying of a process result, executes a process relating to the load frequency control of the power system 20, and the like. The processor 24 may be a CPU (Central Processing Unit) or a GPU (Graphics Processing Unit). The processor 24 may be a single-core processor or a multicore processor. The processor 24 may include a hardware circuit (for example, an FPGA (Field-Programmable Gate Array) or an ASIC (Application Specific Integrated Circuit)) that executes a part of the process or the entire process. The processor 24 may include a neural network. The processor 24 may be constituted as one or multiple semiconductor chips or may be constituted as a computer device such as a computing server.

The memory 25 is, for example, constituted as a RAM (Random Access Memory), stores the computer program and calculation result data, and provides a work area necessary for each process to the processor 24.

The storage device 26 is a storage device having a large storage capacity and is, for example, a hard disk device or an SSD (Solid State Drive). The storage device 26 can hold execution files of various programs and data to be used to execute the programs. The storage device 26 can hold an output distribution ratio function database DB1 and an output distribution instruction value database DB2. In addition, the storage device 26 can hold a load frequency control program. The load frequency control program may be software installable in the load frequency control device 10A or may be embedded as firmware in the load frequency control device 10A.

The output distribution ratio function database DB1 stores an output distribution ratio function. The output distribution ratio function is a function of providing, according to an economic efficiency, a ratio (output distribution weight) of output distribution of regulated power output based on the AR. The ratio of the output distribution according to the economic efficiency can be given by a function of a frequency fluctuation of the power system, for example. The output distribution instruction value database DB2 stores an output distribution instruction value to each regulated power source.

The load frequency control device 10A can access measurement information of the power system 20 via the communication network 300, and the like. The power system 20 is a system in which a plurality of power generators 23A to 23D and loads 25A, 25B, and 25D to 25F are interconnected to each other via bus bars (nodes) 21A to 21F, transformers 22A to 22D, electric power transmission lines (branches) 24A to 24E, and the like. The power generators 23A to 23D are, for example, thermal power generators, hydroelectric generators, or nuclear power generators. In the nodes 21A to 21F, various measurers configured to protect, control, and monitor the power system 20 are installed. In addition, in each of the nodes 21A to 21D, storage batteries 26A to 26D and renewable energy power generators 27A to 27D are connected. The renewable energy power generators 27A to 27D are, for example, photovoltaic power generators, solar thermal power generators, or wind power generators.

The load frequency control device 10A can access signals detected by the measurers or the like via the communication network 300 and acquire a system frequency deviation $\Delta f$ and a tie-line power flow deviation $\Delta Pt$.

The processor 24 reads the load frequency control program into the memory 25 and executes the load frequency control program, thereby calculating an AR to be used for the load frequency control and determining an output distribution ratio of the AR according to the merit order. The processor 24 can determine, based on the determined output distribution ratio, output distribution according to the merit order for a regulated power source.

In the determination of the output distribution according to the merit order, the processor 24 can reference the output distribution ratio function database DB1. In this case, the processor 24 can reduce the output distribution ratio according to the merit order with an increase in a frequency fluctuation.

Therefore, when the frequency fluctuation is large, a ratio of output distribution to a distribution destination that largely contributes to the suppression of the frequency fluctuation can be large and the system frequency can remain at or lower than a management target value. The distribution destination that largely contributes to the suppression of the frequency fluctuation is, for example, a power generator of which an output change speed is high. On the other hand, when the frequency fluctuation is small, a ratio of output distribution to a distribution destination that largely contributes to a reduction of the cost can be large and the cost can be reduced.

Furthermore, the processor 24 determines output distribution of a regulated power source according to the merit order in such a manner that an area requirement based on the ratio of output distribution according to the merit order is satisfied. The output distribution can be allocated to the power generators 23A to 23D, the storage batteries 26A to 26D, and a demand response. When the processor 24 determines the output distribution to each of the regulated power sources, the processor 24 causes output distribution instruction values to the regulated power sources to be stored in the output distribution instruction value database DB2.

To calculate the AR, the FFC method may be used or the TBC method may be used. In the TBC method, the AR can be calculated from Equation (1). In the FFC method, the AR can be calculated by omitting the frequency deviation $\Delta f$ from Equation (1) of the TBC method. Of the system frequency deviation $\Delta f$ and the tie-line power flow deviation $\Delta Pt$, only the system frequency deviation $\Delta f$ may be used to calculate the AR.

The execution of the load frequency control program may be shared by a plurality of processors or computers. Alternatively, the processor 24 may instruct a cloud computer or the like to execute a part of the load frequency control program or the entire load frequency control program via the communication network 300 and may receive results of the execution.

In addition, although FIG. 1 illustrates the example in which the load frequency control device 10A holds the output distribution ratio function database DB1 and the output distribution instruction value database DB2, at least one of the output distribution ratio function database DB1 and the output distribution instruction value database DB2 may be held in a cloud server.

Figure 2:
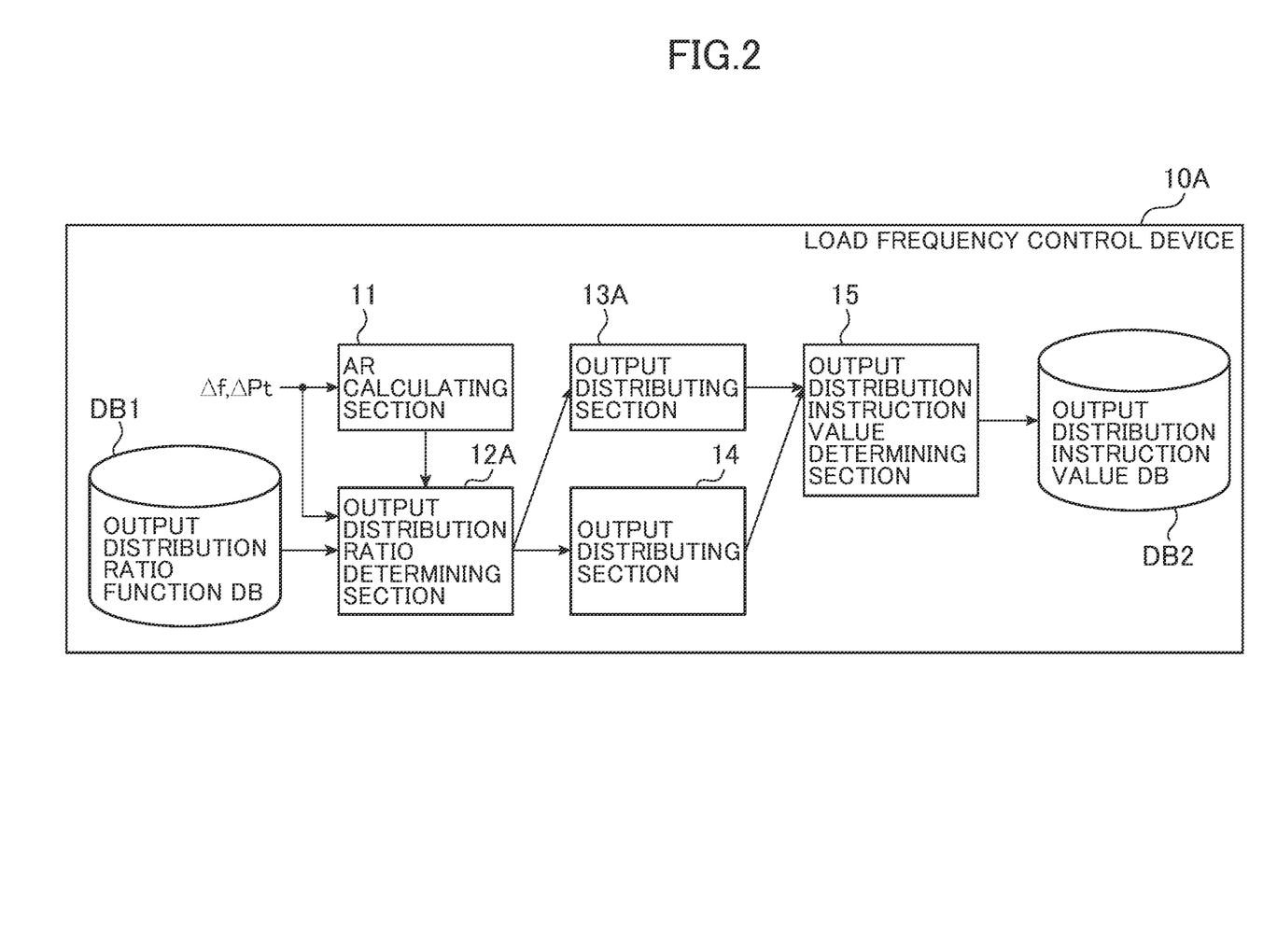
FIG. 2 is a block diagram illustrating a functional configuration of the load frequency control device according to the first embodiment.

FIG. 2 is a block diagram illustrating a functional configuration of the load frequency control device according to the first embodiment. In the following description, it is assumed that when a main operating section such as an "XX section" is described, the processor 24 illustrated in FIG. 1 reads the XX section which is a program and loads the XX section into a DRAM (Dynamic Random Access Memory), thereby achieving a function of the XX section.

In FIG. 2, the load frequency control device 10A includes the output distribution ratio function database DB1, the output distribution instruction value database DB2, an AR calculating section 11, an output distribution ratio determining section 12A, output distributing sections 13A and 14, and an output distribution instruction value determining section 15.

The AR calculating section 11 calculates an AR using the system frequency deviation $\Delta f$ and the tie-line power flow deviation $\Delta Pt$ as inputs and outputs the AR to the output distribution ratio determining section 12A. The AR calculating section 11 can use Equation (1) to calculate the AR. Either one or both of the system frequency deviation $\Delta f$ and the tie-line power flow deviation $\Delta Pt$ may be used to calculate the AR.

The output distribution ratio determining section 12A determines a ratio of output distribution according to the merit order for the AR calculated by the AR calculating section 11. Furthermore, the output distribution ratio determining section 12A determines a ratio of output distribution according to an output change speed based on the output distribution ratio according to the merit order. In this case, the output distribution ratio determining section 12A can match the sum of the output distribution according to the merit order and the output distribution according to the output change speed with the AR calculated by the AR calculating section 11.

In this case, the output distribution ratio determining section 12A can change the output distribution ratio according to the merit order, based on a frequency fluctuation of the power system 20. The frequency fluctuation can be given by the system frequency deviation $\Delta f$. In this case, the output distribution ratio determining section 12A references the output distribution ratio function database DB1 and can change, based on the frequency fluctuation, the output distribution ratio according to the merit order in accordance with an output distribution ratio function indicating a relationship between a frequency fluctuation and an output distribution ratio.

The output distribution ratio determining section 12A may change the output distribution ratio according to the merit order, based on the magnitude of the AR calculated by the AR calculating section 11. In this case, in the output distribution ratio function database DB1, an output distribution ratio function that indicates a relationship between the magnitude of the AR and the output distribution ratio can be registered.

Alternatively, the output distribution ratio determining section 12A may change, based on the tie-line power flow deviation $\Delta Pt$, the ratio of output distribution according to the merit order. In this case, in the output distribution ratio function database DB1, an output distribution ratio function that indicates a relationship between the tie-line power flow deviation $\Delta Pt$ and the output distribution ratio can be registered.

The output distributing section 13A determines output distribution to a regulated power source according to the output change speed, based on the output distribution ratio determined by the output distribution ratio determining section 12A according to the output change speed. For example, when the output distribution ratio according to the output change speed is H1, a sum D1 of output distribution to the regulated power sources according to the output change speed can be given according to an equation of $D1=H1 \times AR$. Then, the output distributing section 13A can determine output distribution to each regulated power source according to the output change speed in such a manner that the sum D1 of the output distribution is satisfied.

The output distributing section 14 determines output distribution to the regulated power sources according to the merit order, based on the output distribution ratio determined by the output distribution ratio determining section 12A according to the merit order. For example, when the output distribution ratio according to the merit order is H2, a sum D2 of output distribution to the regulated power sources according to the merit order is given according to an equation of $D2=H2 \times AR$. Then, the output distributing section 14 can determines output distribution to each regulated power source according to the merit order in such a manner that the sum D2 of the output distribution is satisfied.

The output distribution instruction value determining section 15 determines output distribution instruction values to the respective regulated power sources using, as inputs, output distribution values determined by the output distributing sections 13A and 14 and causes the output distribution instruction values to be stored in the output distribution instruction value database DB2.

Regarding the foregoing method (instruction value or pulse) of instructing output distribution, there are many distribution targets and methods for transmitting instruction values. The foregoing method is not limited to a specific system.

Figure 3:
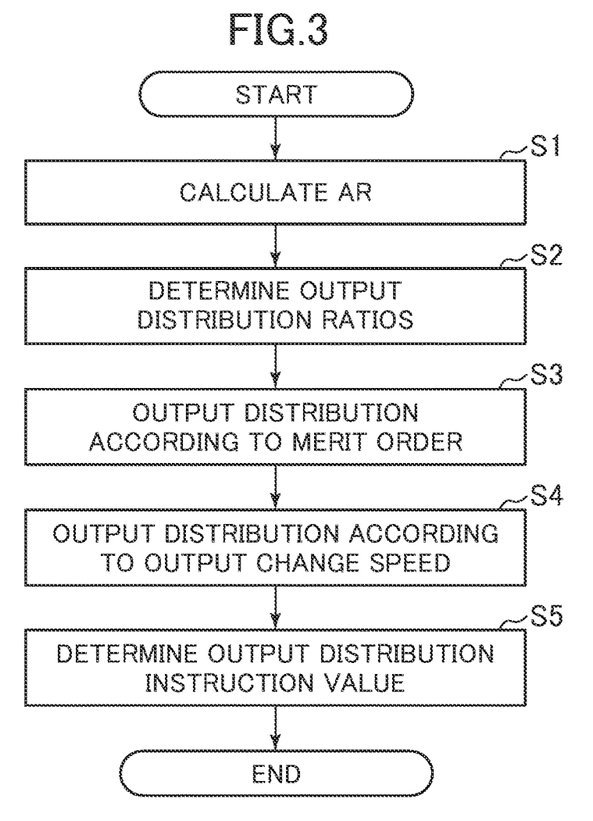
FIG. 3 is a flowchart illustrating a process to be performed by the load frequency control device illustrated in FIG. 2.

FIG. 3 is a flowchart illustrating a process to be executed by the load frequency control device illustrated in FIG. 2. In FIG. 3, in step S1, the AR calculating section 11 illustrated in FIG. 2 calculates the AR based on the system frequency deviation $\Delta f$ and the tie-line power flow deviation $\Delta Pt$.

Next, in step S2, the output distribution ratio determining section 12A determines a ratio of output distribution according to the merit order and a ratio of output distribution according to an output change speed, based on the AR calculated by the AR calculating section 11, the system frequency deviation $\Delta f$ input from an external, and the output distribution ratio function stored in the output distribution ratio function database DB1. In this case, the output distribution ratio determining section 12A can determine the ratio of output distribution according to the merit order for the AR calculated by the AR calculating section 11 in such a manner that the system frequency is in the acceptable range.

Next, in step S3, the output distributing section 14 determines output distribution to each regulated power source according to the merit order, based on the output distribution ratio determined by the output distribution ratio determining section 12A according to the merit order.

In this case, the output distributing section 14 can determine output distribution to each regulated power source according to the merit order in such a manner that an area requirement allocated at the ratio of the output distribution according to the merit order is satisfied. For an increase due to regulated power, when the output distribution to each regulated power source is determined according to the merit order, regulated power can be allocated to each regulated power source in order from a regulated power source with the lowest cost in such a manner that the allocated power is in a limited range in which power is allocatable to each regulated power source. For a reduction due to regulated power, regulated power can be allocated to each regulated power source in order from a regulated power source with the highest cost in such a manner that the allocated power is in the limited range in which power is allocatable to each regulated power source.

Next, in step S4, the output distributing section 13A determines output distribution to each regulated power source according to the output change speed, based on the output distribution ratio determined by the output distribution ratio determining section 12A according to the output change speed.

In this case, the output distributing section 13A can determine output distribution to each regulated power source at a ratio according to an output change speed of each regulated power source in such a manner that an area requirement allocated at the ratio of output distribution according to the output change speed is satisfied and that allocated power is in the limited range in which power is allocatable to each regulated power source.

Next, in step S5, the output distribution instruction value determining section 15 determines, for each regulated power source, an output distribution value to be distributed to each regulated power source according to the merit order and an output distribution instruction value determined according to the output change speed based on the output distribution values to the regulated power sources.

Figure 4:
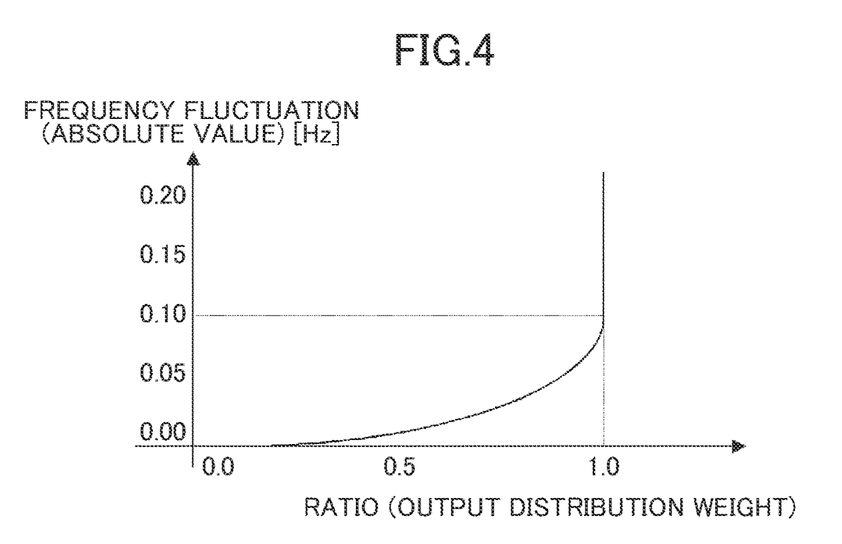
FIG. 4 is a diagram illustrating an example of a relationship between a frequency fluctuation to be referenced by an output distribution ratio determining section illustrated in FIG. 2 and an output distribution ratio according to an output change speed.

FIG. 4 is a diagram illustrating an example of a relationship between a frequency fluctuation to be referenced by the output distribution ratio determining section illustrated in FIG. 2 and an output distribution ratio according to an output change speed.

In FIG. 4, the output distribution ratio function database DB1 illustrated in FIG. 2 holds the output distribution ratio function. The output distribution ratio function reduces a ratio of output distribution according to the merit order with an increase in a frequency fluctuation.

For example, when the frequency fluctuation is 0.00 Hz, the output distribution ratio function sets the ratio to 0.0. When the ratio is 0.0, the output distribution ratio function indicates that a ratio of output distribution according to the output change speed is 0% and that a ratio of output distribution according to the merit order is 100%. When the frequency fluctuation is larger than 0.00 Hz and smaller than 0.10 Hz, the output distribution ratio function sets the ratio to a ratio larger than 0.0 and smaller than 1.0. When the ratio is larger than 0.0 and smaller than 1.0, the sum of the ratio of output distribution according to the output change speed and the ratio of output distribution according to the merit order is 100%. When the frequency fluctuation is equal to or larger than 0.10 Hz, the output distribution ratio function sets the ratio to 1.0. When the ratio is 1.0, the output distribution ratio function indicates that the ratio of output distribution according to the output change speed is 100% and that the ratio of output distribution according to the merit order is 0%.

The output distribution ratio determining section 12A may determine a ratio of output distribution according to the output change speed and a ratio of output distribution according to the merit order based on a result of referencing the output distribution ratio function illustrated in FIG. 4. When the frequency exceeds a threshold, the output distribution ratio determining section 12A may switch the ratio of output distribution according to the output change speed from 0% to 100% and switch the ratio of output distribution according to the merit order from 100% to 0%.

Figure 5A:
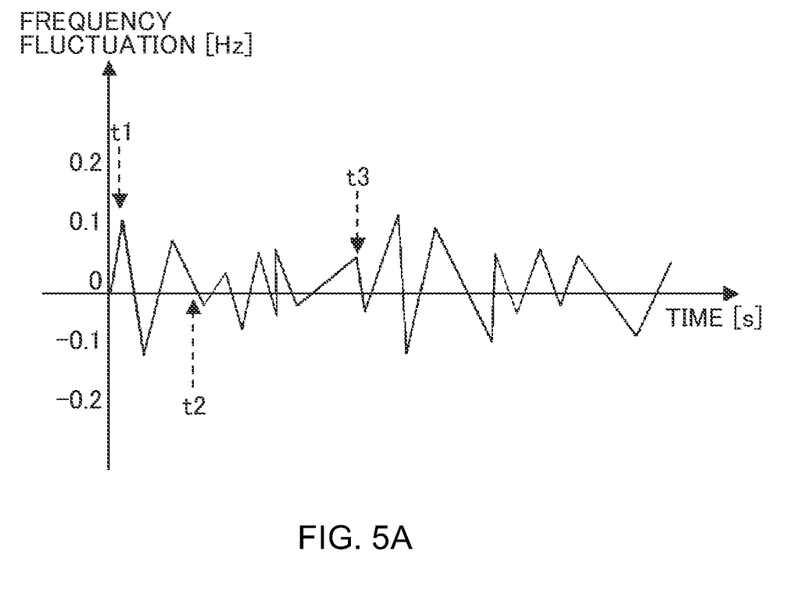
FIG. 5(a) is a diagram illustrating an example of a method for referencing a frequency fluctuation at the time of output distribution ratio determination illustrated in FIG. 3.
Figure 5B:
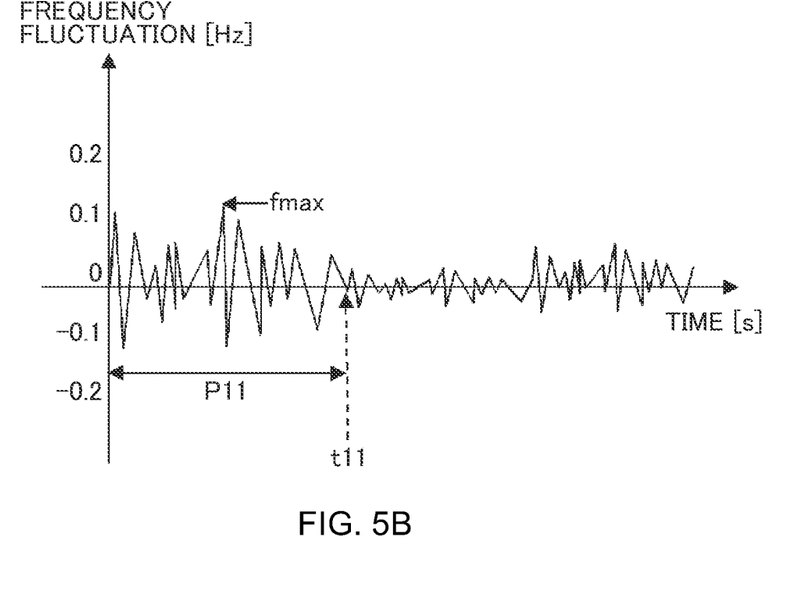
FIG. 5(b) is a diagram illustrating another example of the method for referencing a frequency fluctuation at the time of the output distribution ratio determination illustrated in FIG. 3.

FIG. 5(a) is a diagram illustrating an example of a method for referencing a frequency fluctuation at the time of the output distribution ratio determination illustrated in FIG. 3. FIG. 5(b) is a diagram illustrating another example of the method for referencing a frequency fluctuation at the time of the output distribution ratio determination illustrated in FIG. 3.

In FIG. 5(a), the output distribution ratio determining section 12A illustrated in FIG. 2 monitors a frequency fluctuation. The output distribution ratio determining section 12A determines a ratio of output distribution according to an output change speed and a ratio of the output distribution according to the merit order based on an instantaneous value of the frequency fluctuation. In this case, when the frequency fluctuation is large, the output distribution ratio determining section 12A increases the ratio of the output distribution according to the output change speed. When the frequency fluctuation is small, the output distribution ratio determining section 12A increases the ratio of the output distribution according to the merit order.

For example, it is assumed that the output distribution ratio determining section 12A references the frequency fluctuation at time t1 and determines the output distribution ratios. Since the frequency fluctuation at the time t1 is 0.1, the output distribution ratio determining section 12A acquires, from the output distribution ratio function illustrated in FIG. 4, an output distribution ratio associated with the frequency fluctuation of 0.1. Since the output distribution ratio associated with the frequency fluctuation of 0.1 is 1.0 according to the output distribution ratio function illustrated in FIG. 4, the output distribution ratio determining section 12A sets the ratio of output distribution according to the output change speed to 100% and sets the ratio of output distribution according to the merit order to 0%.

In addition, for example, it is assumed that the output distribution ratio determining section 12A references the frequency fluctuation at time t2 and determines the output distribution ratios. Since the frequency fluctuation at the time t2 is 0, the output distribution ratio determining section 12A acquires, from the output distribution ratio function illustrated in FIG. 4, an output distribution ratio associated with the frequency fluctuation of 0. Since the output distribution ratio associated with the frequency fluctuation of 0 is 0.0, the output distribution ratio determining section 12A sets the ratio of output distribution according to the output change speed to 0% and sets the ratio of output distribution according to the merit order to 100%.

Furthermore, for example, it is assumed that the output distribution ratio determining section 12A references the frequency fluctuation at time t3 and determines the output distribution ratios. Since the frequency fluctuation at the time t3 is 0.05, the output distribution ratio determining section 12A acquires, from the output distribution ratio function illustrated in FIG. 4, an output distribution ratio associated with the frequency fluctuation of 0.05. Since the output distribution ratio associated with the frequency fluctuation of 0.05 is 0.9, the output distribution ratio determining section 12A sets the ratio of output distribution according to the output change speed to 90% and sets the ratio of output distribution according to the merit order to 10%.

In this case, the output distribution ratio determining section 12A can update the output distribution ratios at time intervals shorter than a load fluctuation time period of several minutes to approximately 20 minutes that is estimated in the LFC. For example, the output distribution ratio determining section 12A can update the output distribution ratios at time intervals of 5 seconds.

On the other hand, as illustrated in FIG. 5(b), the output distribution ratio determining section 12A may determine a ratio of current output distribution according to the merit order based on the maximum value fmax of the frequency fluctuation in a predetermined time zone P11 before time t11 of the current output distribution. For example, it is assumed that the maximum value fmax of the frequency fluctuation in the time zone P11 is 0.1 and is to be used to determine the current output distribution. The output distribution ratio determining section 12A acquires, from the output distribution ratio function illustrated in FIG. 4, the output distribution ratio associated with the frequency fluctuation of 0.1. Since the output distribution ratio associated with the frequency fluctuation of 0.1 is 1.0 according to the output distribution ratio function illustrated in FIG. 4, the output distribution ratio determining section 12A sets the ratio of output distribution according to the output change speed to 100% and sets the ratio of output distribution according to the merit order to 0%.

A range of the time zone P11 can be set based on the load fluctuation time period of several minutes to approximately 20 minutes that is estimated in the LFC.

Figure 6A:
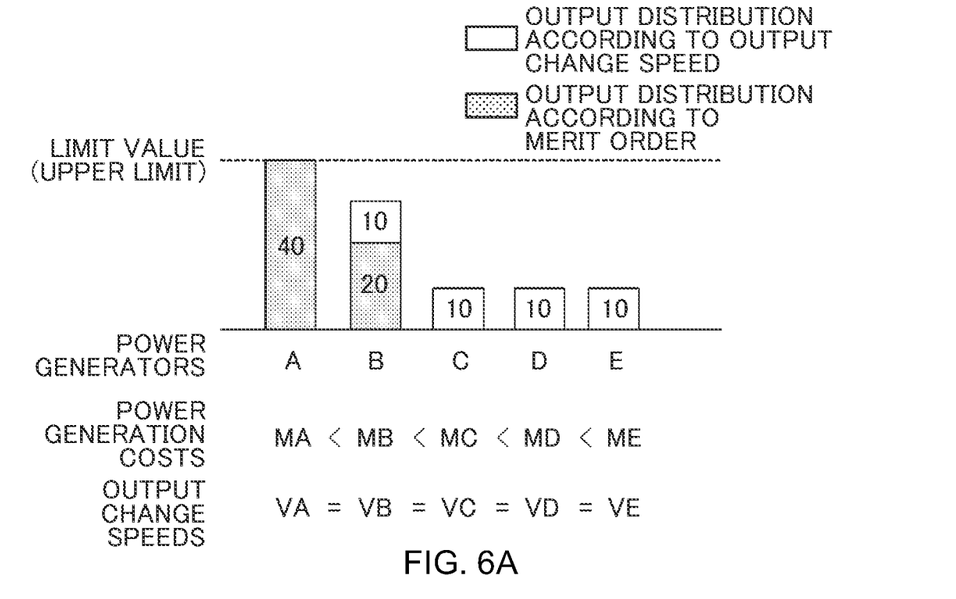
FIG. 6(a) is a diagram illustrating an example of output distribution to each power generator based on an output distribution ratio according to an output change speed and an output distribution ratio according to merit order.
Figure 6B:
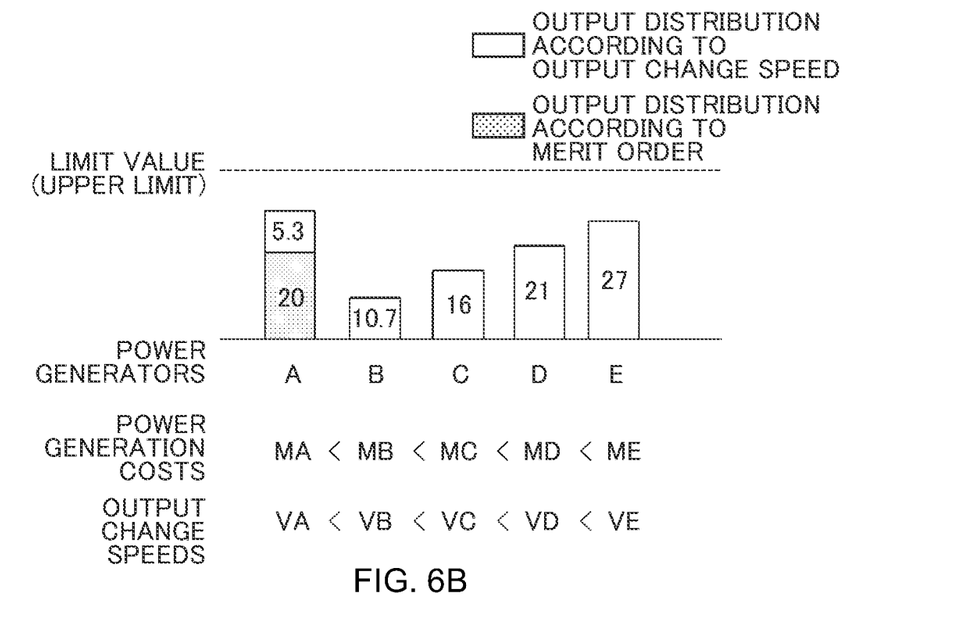
FIG. 6(b) is a diagram illustrating another example of output distribution to each power generator based on an output distribution ratio according to an output change speed and an output distribution ratio according to the merit order.

FIG. 6(a) is a diagram illustrating an example of output distribution to each power generator based on an output distribution ratio according to the output change speed and an output distribution ratio according to the merit order. FIG. 6(b) is a diagram illustrating another example of output distribution to each power generator based on an output distribution ratio according to the output change speed and an output distribution ratio according to the merit order.

In FIG. 6(a), it is assumed that the output distribution ratio determining section 12A illustrated in FIG. 2 determines that the ratio of output distribution according to the merit order is 60% and that the ratio of output distribution according to the output change speed is 40%.

In this case, for example, after the output distributing section 14 distributes output for 60% of the AR to a regulated power source according to the merit order, the output distributing section 13A distributes output for 40% of the AR to a regulated power source according to the output change speed.

For example, it is assumed that distribution destinations of the AR are power generators A to E. In this case, it is assumed that power generation costs MA to ME of the power generators A to E have relationships of MA<MB<MC<MD<ME. In addition, it is assumed that output change speeds VA to VE of the power generators A to E have relationships of VA=VB=VC=VD=VE. Furthermore, it is assumed that a limit value that can be distributed to the power generators A to E is 40% of the AR calculated by the AR calculating section 11.

In this case, for example, the output distributing section 14 allocates 40% of the AR to the power generator A with the lowest power generation cost. Furthermore, the output distributing section 14 allocates 20% of the AR to the power generator B with the second lowest power generation cost. Next, the output distributing section 13A evenly distributes 40% of the AR to the power generators B to E or allocates 10% of the AR to each of the power generators B to E.

In addition, in FIG. 6(b), for example, it is assumed that the output distribution ratio determining section 12A determines that the ratio of output distribution according to the merit order is 20% and that the ratio of output distribution according to the output change speed is 80%.

In this case, for example, after the output distributing section 14 distributes output for 20% of the AR to a regulated power source according to the merit order, the output distributing section 13A distributes output for 80% of the AR to a regulated power source according to the output change speed.

For example, it is assumed that distribution destinations of the AR are the power generators A to E. In this case, it is assumed that the power generation costs MA to ME of the power generators A to E have relationships of MA<MB<MC<MD<ME. In addition, it is assumed that the output change speeds VA to VE of the power generators A to E have relationships of VA<VB<VC<VD<VE. Furthermore, it is assumed that a limit value that can be distributed to the power generators A to E is 40% of the AR calculated by the AR calculating section 11.

In this case, for example, the output distributing section 14 allocates 20% of the AR to the power generator A with the lowest power generation cost. Next, the output distributing section 13A distributes 80% of the AR at ratios based on the output change speeds VA to VE of the power generators A to E. For example, it is assumed that the ratios based on the output change speeds of the power generators A to E are 1:2:3:4:5.

In this case, the output distributing section 13A calculates 5.3%=80×1/(1+2+3+4+5) as the ratio of distribution to the power generator A, 10.7%=80×2/(1+2+3+4+5) as the ratio of distribution to the power generator B, 16%=80×3/(1+2+3+4+5) as the ratio of distribution to the power generator C, 21%=80×4/(1+2+3+4+5) as the ratio of distribution to the power generator D, and 27%=80×5/(1+2+3+4+5) as the ratio of distribution to the power generator E.

Then, the output distributing section 13A allocates 5.3% of the AR to the power generator A, allocates 10.7% of the AR to the power generator B, allocates 16% of the AR to the power generator C, allocates 21% of the AR to the power generator D, and allocates 27% of the AR to the power generator E.

When output is distributed according to the output change speeds after output is distributed according to the merit order, a power generator of which values exceed limit values (constraint for a capacity and constraint for an output change speed) may be present. In this case, the excess may be redistributed to a power generator of which values are equal to or lower than limit values. In addition, the order that the output distribution of both is summed may be vice versa. Alternatively, the output distribution of both may be summed after the output distribution of both is determined in parallel.

As described above, according to the foregoing first embodiment, it is possible to allocate regulated power to a regulated power source according to the merit order while allocating regulated power to a regulated power source according to an output change speed in such a manner that the system frequency is in the acceptable range. It is possible to reduce the cost while suppressing a frequency fluctuation caused by a load fluctuation.

Figure 7:
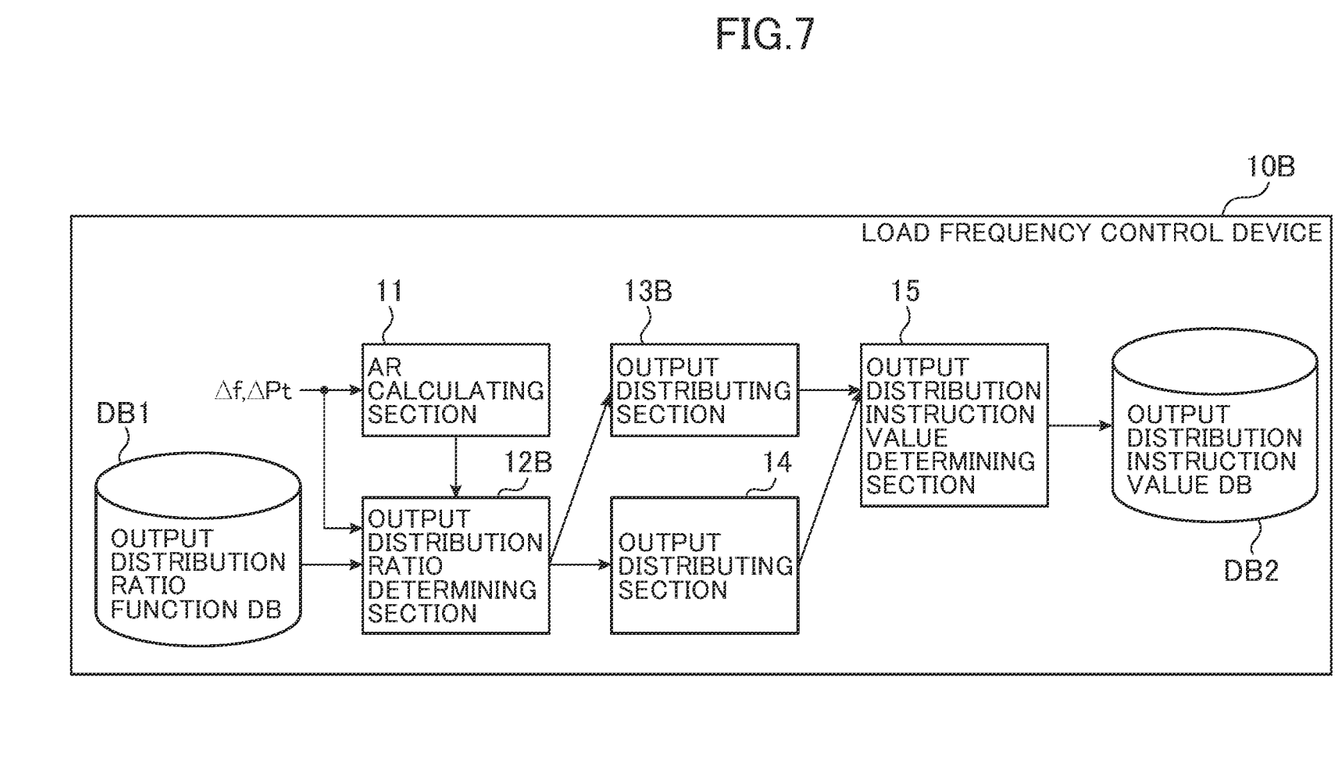
FIG. 7 is a block diagram illustrating a functional configuration of a load frequency control device according to a second embodiment.

FIG. 7 is a block diagram illustrating a functional configuration of a load frequency control device according to a second embodiment.

In FIG. 7, the load frequency control device 10B includes an output distribution ratio determining section 12B and an output distributing section 13B, instead of the output distribution ratio determining section 12A and the output distributing section 13A that are included in the load frequency control device 10A illustrated in FIG. 2.

The output distribution ratio determining section 12B determines a ratio of output distribution according to the merit order and a ratio of output distribution according to an output change speed based on the AR calculated by the AR calculating section 11, the system frequency deviation $\Delta f$ input from the external, the output distribution ratio function stored in the output distribution ratio function database DB1. A distribution coefficient for distribution to each regulated power source can be set in advance. The output distribution ratio determining section 12B operates in the same manner as the output distribution ratio determining section 12A illustrated in FIG. 2, except that the output change speed is replaced with the distribution coefficient.

The output distributing section 13B determines output distribution according to the distribution coefficient for distribution to each regulated power source based on the output distribution ratio determined by the output distribution ratio determining section 12B according to the distribution coefficient.

As described above, according to the foregoing second embodiment, it is possible to allocate regulated power to a regulated power source according to the merit order while allocating regulated power to a regulated power source according to the distribution coefficient in such a manner that the system frequency is in the acceptable range, and it is possible to reduce the cost while suppressing a frequency fluctuation caused by a load fluctuation.

Figure 8:
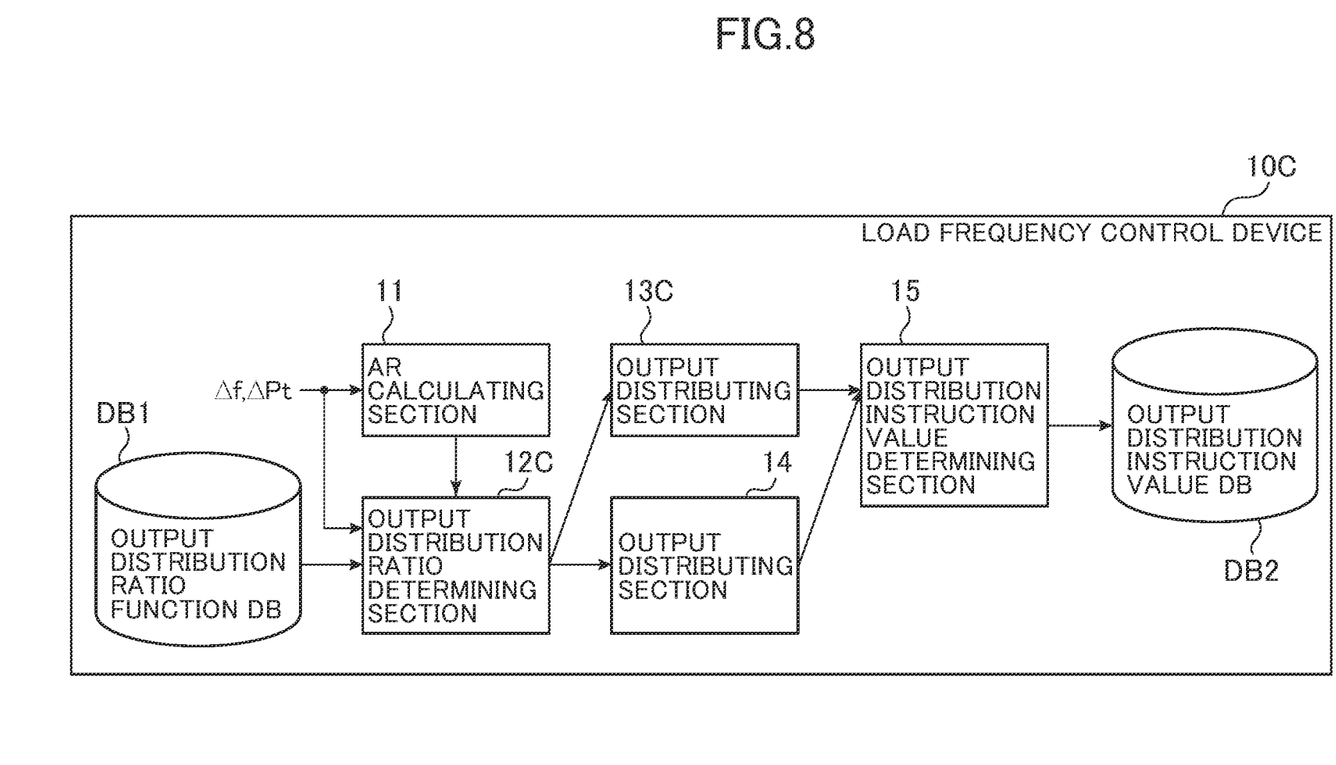
FIG. 8 is a block diagram illustrating a functional configuration of a load frequency control device according to a third embodiment.

FIG. 8 is a block diagram illustrating a functional configuration of a load frequency control device according to a third embodiment.

In FIG. 8, the load frequency control device 10C includes an output distribution ratio determining section 12C and an output distributing section 13C, instead of the output distribution ratio determining section 12A and the output distributing unit 13A that are included in the load frequency control device 10A illustrated in FIG. 2.

The output distribution ratio determining section 12C determines a ratio of output distribution according to the merit order and a ratio of output distribution according to an LFC standard value based on the AR calculated by the AR calculating section 11, the system frequency deviation Δf input from the external, and the output distribution ratio function stored in the output distribution ratio function database DB1. The output distribution ratio determining section 12C operates in the same manner as the output distribution ratio determining section 12A illustrated in FIG. 2, except that the output change speed is replaced with the LFC standard value.

The output distributing section 13C determines output distribution to each regulated power source according to the LFC standard value based on the output distribution ratio determined by the output distribution ratio determining section 12C according to the LFC standard value. In this case, the output distributing section 13C can distribute output in such a manner that the output after the AR distribution is based on the LFC standard value. For example, the output distributing section 13C can determine output distribution to each regulated power source based on a difference from the LFC standard value for each regulated power source in such a manner that an area requirement allocated at the output distribution ratio according to the LFC standard value is satisfied.

As described above, according to the foregoing third embodiment, it is possible to allocate regulated power to a regulated power source according to the merit order while allocating regulated power to a regulated power source according to the LFC standard value in such a manner that the system frequency is in the acceptable range, and it is possible to reduce the cost while suppressing a frequency fluctuation caused by a load fluctuation.

Figure 9:
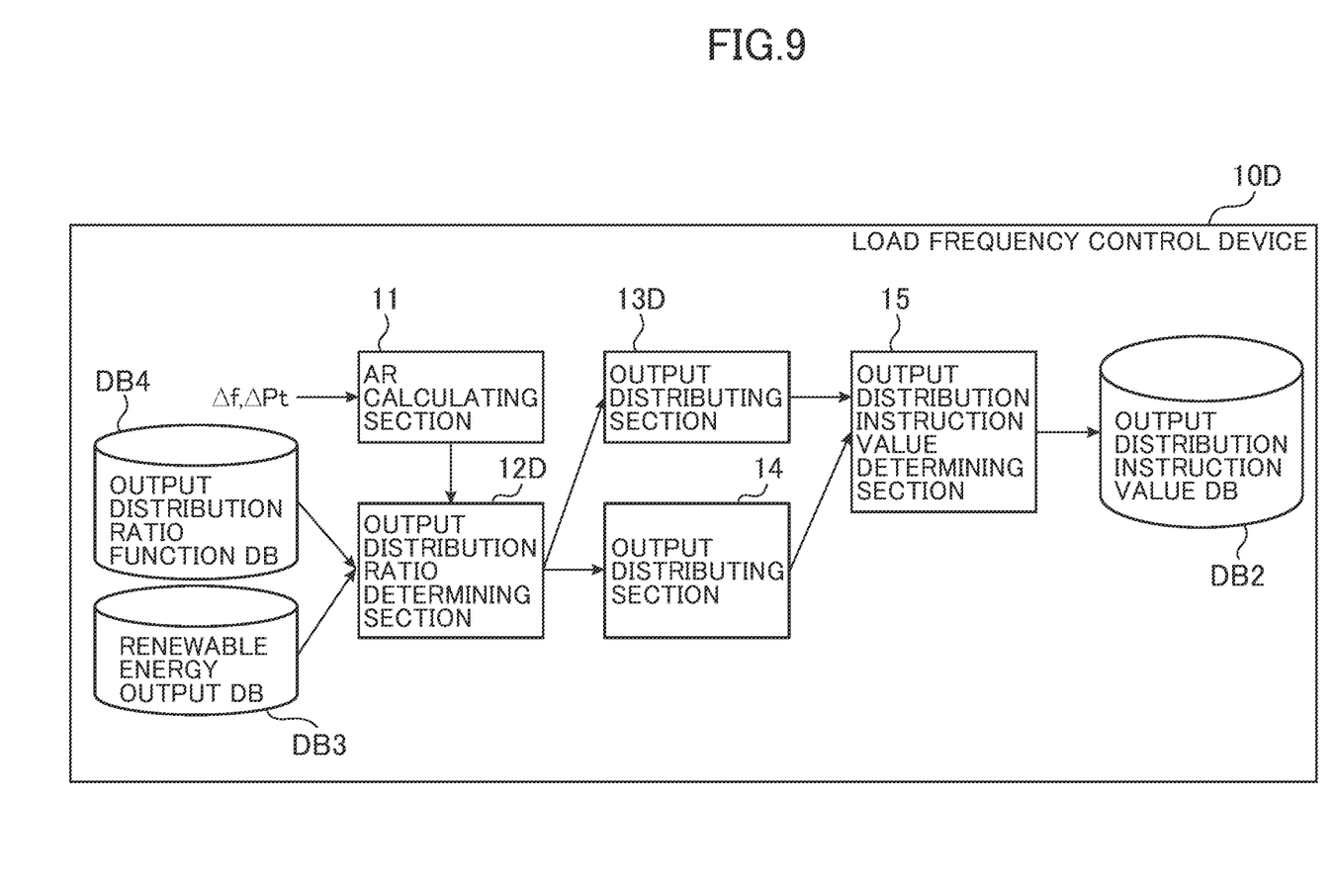
FIG. 9 is a block diagram illustrating a functional configuration of a load frequency control device according to a fourth embodiment.

FIG. 9 is a block diagram illustrating a functional configuration of a load frequency control device according to a fourth embodiment.

In FIG. 9, the load frequency control device 10D includes an output distribution ratio determining section 12D and an output distributing section 13D, instead of the output distribution ratio determining section 12A and the output distributing section 13A that are included in the load frequency control device 10A illustrated in FIG. 2. In addition, the load frequency control device 10D includes a renewable energy output database DB3 and an output distribution ratio function database DB4, instead of the output distribution ratio function database DB1 illustrated in FIG. 2.

The renewable energy output database DB3 stores a predicted value of renewable energy output. The output distribution ratio function database DB4 stores an output distribution ratio function indicating a relationship between renewable energy output and an output distribution ratio.

The output distribution ratio determining section 12D determines a ratio of output distribution according to the merit order and a ratio of output distribution according to an output change speed based on the predicted value, stored in the renewable energy output database DB3, of renewable output and the output distribution ratio function stored in the output distribution ratio function database DB1.

The output distributing section 13D determines output distribution to each regulated power source according to the output change speed based on the output distribution ratio determined by the output distribution ratio determining section 12D according to the output change speed. In this case, the output distributing section 13D can operate in the same manner as the output distributing section 13A illustrated in FIG. 13.

Figure 10:
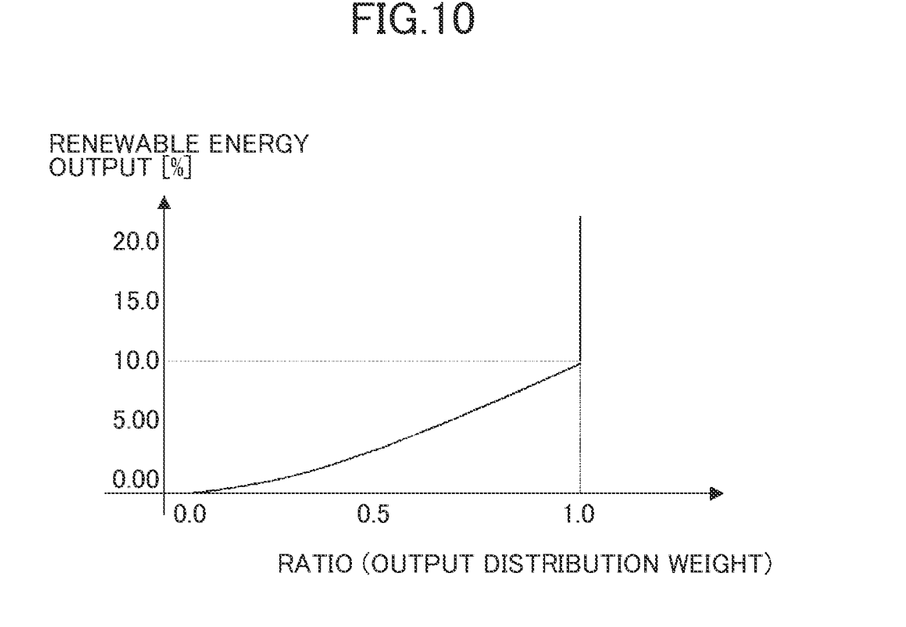
FIG. 10 is a diagram illustrating an example of a relationship between renewable energy output to be referenced by an output distribution ratio determining section illustrated in FIG. 9 and an output distribution ratio.

FIG. 10 is a diagram illustrating a relationship between renewable energy output to be referenced by the output distribution ratio determining section illustrated in FIG. 9 and an output distribution ratio.

In FIG. 10, an output distribution ratio function stored in the output distribution ratio function database DB4 illustrated in FIG. 9 reduces the output distribution ratio according to the merit order as the renewable energy output increases.

For example, when the renewable energy output is 0.0 (%), the output distribution ratio function sets the ratio to 0.0. When the ratio is 0.0, the output distribution ratio function indicates that the output distribution ratio according to the output change speed is 0% and that the output distribution ratio according to the merit order is 100%. When the renewable energy output is larger than 0.0(%) and smaller than 10.0(%), the output distribution ratio function sets the ratio to a ratio larger than 0.0 and smaller than 1.0. When the ratio is larger than 0.0 and smaller than 1.0, the sum of the ratio of output distribution according to the merit order and the ratio of output distribution according to the output change speed is 100%. When the renewable energy output is 10.0(%), the output distribution ratio function sets the ratio to 1.0. When the ratio is 1.0, the output distribution ratio function indicates that the ratio of output distribution according to the output change speed is 100% and that the ratio of output distribution according to the merit order is 0%.

The output distribution ratio determining section 12D illustrated in FIG. 9 references the renewable energy output database DB3 and acquires a predicted value of the renewable energy output. Then, the output distribution ratio determining section 12D references the output distribution ratio function database DB4, acquires an output distribution ratio associated with the predicted value of the renewable energy output, and determines the ratio of output distribution according to the merit order and the ratio of output distribution according to the output change speed.

As described above, according to the foregoing fourth embodiment, even when the renewable energy output is used as an index, it is possible to determine output distribution ratios of regulated power according to the output change speed and regulated power according to the merit order and it is possible to reduce the cost while suppressing a frequency fluctuation caused by a load fluctuation.

The present invention is not limited to the foregoing embodiments and includes various modifications. For example, the embodiments are described in detail to easily explain the present invention and are not necessarily limited to all the configurations described above. In addition, a part of a configuration described in a certain embodiment can be replaced with a configuration described in another embodiment. In addition, a configuration described in a certain embodiment can be added to a configuration described in another embodiment. Furthermore, for a part of a configuration described in each embodiment, it is possible to add, remove, or replace another configuration. Furthermore, parts of or all of the foregoing configurations, functions, processing sections, and the like may be achieved by hardware, for example, by being designed with an integrated circuit.

DESCRIPTION OF REFERENCE SIGNS

DB1, DB4 Output distribution ratio function database, DB2 Output distribution instruction value database, DB3

Renewable energy output database, 20 Power system, 10A to 10D Load frequency control device, 11 AR calculating section, 12A to 12D Output distribution ratio determining section, 13A to 13D, 14 Output distributing section, 15 Output distribution instruction value determining section, 21 Display unit, 22 Input unit, 23 Communication unit, 24 Processor, 25 Memory, 26 Storage device, 27 Bus, 300 Communication network

The invention claimed is:

1. A load frequency control device comprising:
an AR calculating section that calculates an area requirement to be used for load frequency control;
an output distribution ratio determining section that determines a ratio of output distribution according to an economic efficiency for the area requirement calculated by the AR calculating section and a ratio of power distribution according to an output change speed based on a frequency fluctuation of a power system;
a first output distributing section that determines, based on the ratio of output distribution according to the economic efficiency determined by the output distribution ratio determining section, output distribution according to the economic efficiency for a regulated power source;
a second output distribution section that determines output distribution to the regulated power source at a ratio according to the output change speed of the regulated power source in such a manner that an area requirement allocated at the ratio of output distribution according to the output change speed is satisfied; and
an output distribution ratio function database in which an output distribution ratio function indicating a relationship between the frequency fluctuation of the power system and the ratio of output distribution according to the economic efficiency is registered, wherein
the output distribution ratio determining section determines the ratio of output distribution according to the economic efficiency based on a result of referencing the output distribution ratio function database.

2. The load frequency control device according to claim 1, wherein
the output distribution according to the economic efficiency is output distribution according to merit order.

3. The load frequency control device according to claim 2, wherein
the output distribution ratio determining section determines a ratio of output distribution according to the merit order for the area requirement calculated by the AR calculating section in such a manner that a system frequency is in an acceptable range.

4. The load frequency control device according to claim 3, wherein
the first output distributing section distributes output to the regulated power source according to the merit order in such a manner that an area requirement allocated at the ratio of the output distribution according to the merit order is satisfied.

5. The load frequency control device according to claim 1, wherein
the output distribution ratio determining section updates the ratio of the output distribution according to the economic efficiency at time intervals shorter than a load fluctuation time period estimated in the load frequency control.

6. The load frequency control device according to claim 1, wherein the output distribution ratio determining section determines a ratio of current output distribution according to the economic efficiency, based on a maximum value of the frequency fluctuation in a predetermined time zone before the time of the current output distribution.

7. A load frequency control device comprising:
an AR calculating section that calculates an area requirement to be used for load frequency control;
an output distribution ratio determining section that determines a ratio of output distribution according to an economic efficiency for the area requirement calculated by the AR calculating section and a ratio of output distribution according to a distribution coefficient of a regulated power source;
a first output distribution section that determines output distribution according to the economic efficiency for a regulated power source based on the ratio of output distribution according to the economic efficiency determined by the output distribution ratio determining section, and
a second output distributing section that determines output distribution to the regulated power source at a ratio according to the distribution coefficient of the regulated power source in such a manner that an area requirement allocated at the ratio of output distribution according to the distribution coefficient is satisfied; and
an output distribution ratio function database in which an output distribution ratio function indicating a relationship between the distribution coefficient of the regulated power source and the ratio of output distribution according to the economic efficiency is registered, wherein
the output distribution ratio determining section determines the ratio of output distribution according to the economic efficiency based on a result of referencing the output distribution ratio function database.

8. A load frequency control device comprising:
an AR calculating section that calculates an area requirement to be used for load frequency control;
an output distribution ratio determining section that determines a ratio of output distribution according to an economic efficiency for the area requirement calculated by the AR calculating section and a ratio of output distribution according to an LFC (Load Frequency Control) standard value of a regulated power source;
a first output distribution section that determines output distribution according to the economic efficiency for the regulated power source based on the ratio of output distribution according to the economic efficiency determined by the output distribution ratio determining section;
a second output distributing section that determines output distribution to the regulated power source according to a difference from the LFC standard value in such a manner that an area requirement allocated at the ratio of output distribution according to the LFC standard value is satisfied; and
an output distribution ratio function database in which an output distribution ratio function indicating a relationship between the LFC standard value of the regulated power source and the ratio of output distribution according to the economic efficiency is registered, wherein
the output distribution ratio determining section determines the ratio of output distribution according to the economic efficiency based on a result of referencing the output distribution ratio function database.

9. A load frequency control device comprising:
an AR calculating section that calculates an area requirement to be used for load frequency control;
an output distribution ratio determining section that determines a ratio of output distribution according to an economic efficiency for the area requirement calculated by the AR calculating section and a ratio of output distribution according to an output change speed based on renewable energy output,
a first output distributing section that determines, based on the ratio of output distribution according to the economic efficiency determined by the output distribution ratio determining section, output distribution according to the economic efficiency for a regulated power source;
a second output distribution section that determines output distribution of the regulated power source at a ratio according to the output change speed of the regulated power source in such a manner that the area requirement allocated at the ratio of output distribution according to the output change speed is satisfied;
an output distribution ratio function database in which an output distribution ratio function indicating a relationship between the renewable energy output and the ratio of output distribution according to the economic efficiency is registered; and
a renewable energy output database in which a value of the renewable energy output is registered, wherein
the output distribution ratio determining section determines the ratio of output distribution according to the economic efficiency based on a result of referencing the output distribution ratio function database and the renewable energy output database.

10. A load frequency control method to be executed by a processor, wherein
the processor is configured to
calculate an area requirement to be used for load frequency control,
determine a ratio of output distribution according to an economic efficiency for the calculated area requirement and a ratio of power distribution according to an output change speed based on a frequency fluctuation of a power system,
determine output distribution according to the economic efficiency for a regulated power source based on the ratio of output distribution according to the economic efficiency,
determine output distribution of the regulated power source at a ratio according to the output change speed of the regulated power source in such a manner that the area requirement allocated at the ratio of output distribution according to the output change speed is satisfied, and
register, in an output distribution ratio function database, an output distribution ratio function indicating a relationship between the frequency fluctuation of the power system and the ratio of output distribution according to the economic efficiency, and
the ratio of output distribution according to the economic efficiency is further determined based on a result of referencing the output distribution ratio function database.

\* \* \* \* \*